United States Patent [19]

Constant et al.

[11] 4,250,205

[45] Feb. 10, 1981

[54] PROCESS FOR DEPOSITING A III-V SEMI-CONDUCTOR LAYER ON A SUBSTRATE

[75] Inventors: Georges Constant, Ramonville Saint Agne; Raymond Haran, Grenade; Albert Lebugle, Toulouse; Aref Zaouk, Toulouse; Roland Morancho, Toulouse; Philippe Pouvreau, Maillezais, all of France

[73] Assignee: Agence Nationale de Valorisation de la Recherche (ANVAR), Neuilly sur Seine, France

[21] Appl. No.: 941,728

[22] Filed: Sep. 12, 1978

[30] Foreign Application Priority Data

Sep. 16, 1977 [FR] France ............... 77 28237

[51] Int. Cl.³ .................. H01L 21/205; H01L 21/20
[52] U.S. Cl. ........................ 427/87; 156/613; 156/DIG. 70; 427/226; 427/248.1
[58] Field of Search .......... 427/87, 226, 248 R; 156/613, DIG. 70

[56] References Cited

U.S. PATENT DOCUMENTS

| 3,922,475 | 11/1975 | Manasevit ............ 156/613 |
| 4,141,778 | 2/1979 | Domrachev et al. ............ 156/613 |
| 4,147,571 | 4/1979 | Stringfellow et al. ............ 156/613 |

FOREIGN PATENT DOCUMENTS

| 812818 | 4/1959 | United Kingdom. |
| 908860 | 10/1962 | United Kingdom. |
| 1010063 | 11/1965 | United Kingdom. |
| 1035499 | 7/1966 | United Kingdom. |
| 1134352 | 11/1968 | United Kingdom. |
| 1346323 | 2/1974 | United Kingdom. |

OTHER PUBLICATIONS

Coates et al., "Organometallic Compounds", Methyrn & Co. Ltd., London, pp. 297–313; 348–361.
Haran, "Contribution a l'Etude des Complexes Formes par les Chloroalkylgallium avec dex Bases de Lewis Usuelles: $NR_3$, $PR_3$, $OR_2$, $SR_2$", Sep., 1972.

*Primary Examiner*—John D. Smith
*Attorney, Agent, or Firm*—Sandler & Greenblum

[57] ABSTRACT

A process for depositing a layer of a semiconductor composition comprising elements M(III) and M'(V) selected from group III and group V elements, respectively onto a substrate. The process comprises: contacting the substrate with a coordination compound in the gaseous phase, the compound having the formula:

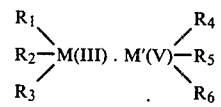

wherein M(III) and M'(V) are bonded to one another by a donor/acceptor bond and wherein $R_1$, $R_2$, $R_3$, $R_4$, $R_5$, and $R_6$ are chemical radicals other than hydrogen with at least one of the radicals $R_1$, $R_2$, and $R_3$ being an electron donor serving to stabilize the donor/acceptor bond between elements M(III) and M'(V). The process further comprises decomposing the coordination compound so as to break the chemical bonds between the radicals and the elements M(III) and M'(V) without breaking the donor/acceptor bond, so as to cause the semi-conductor composition to deposit onto the substrate.

Substrates having a semi-conductor layer comprising elements selected from groups III and V deposited by the process of the invention are also disclosed.

28 Claims, 1 Drawing Figure

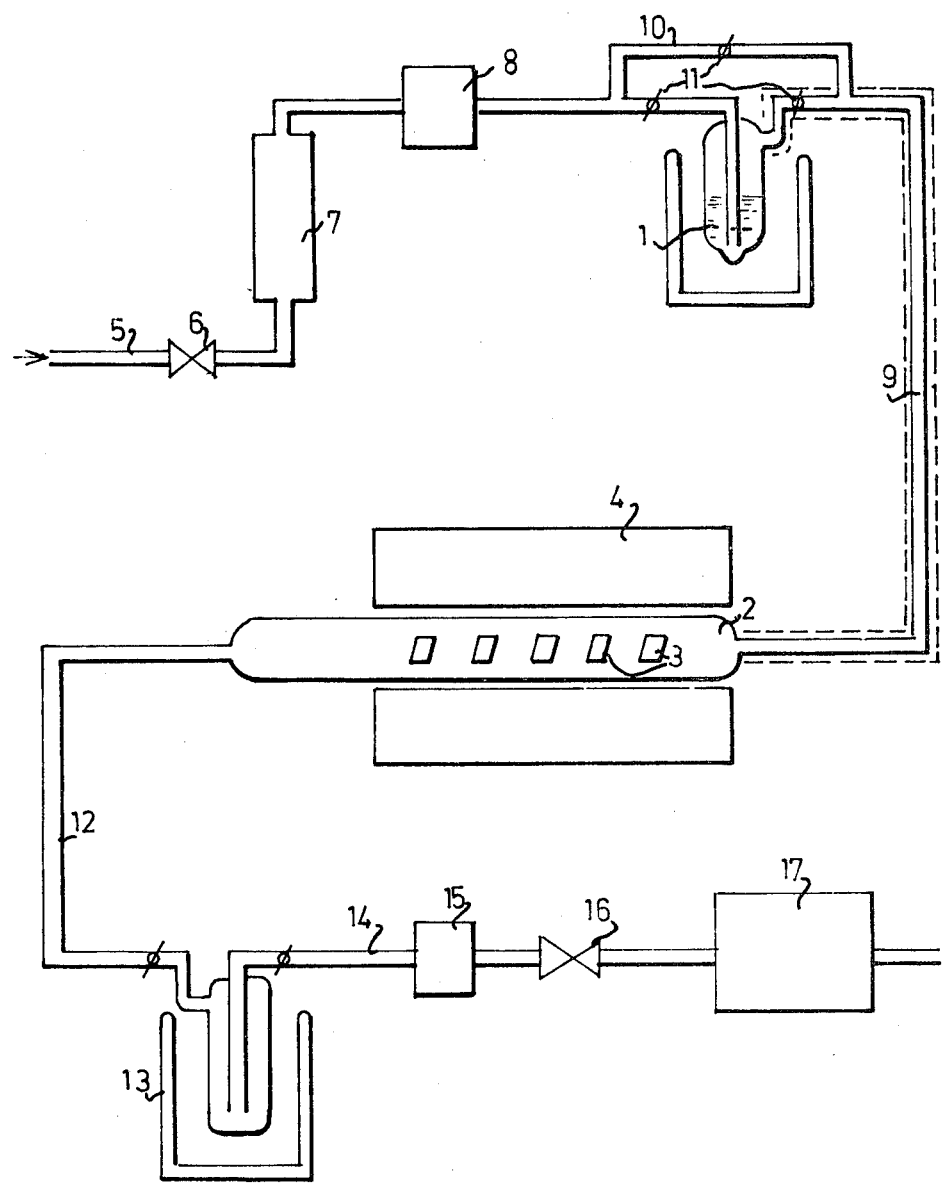

PROCESS FOR DEPOSITING A III-V SEMI-CONDUCTOR LAYER ON A SUBSTRATE

BACKGROUND OF THE INVENTION

1. Field of the Invention

The invention relates to a process of manufacturing, by chemical deposit from the vapor phase, a layer of a semi-conductor composition of the elements of groups III and V onto substrates. The invention further relates to substrates which are at least partially coated with such elements.

2. Description of the Prior Art

Essentially, two types of industrial processes are presently known which make it possible to deposit a semiconductor composition which comprises elements III and V from the vapor phase onto a substrate.

One type of process, known as the chloride process, comprises decomposing, in the presence of a substrate, a gaseous mixture constituted by a chloride of an element of group III and by an element of group V or one of its volatile compositions. The drawbacks of such a process include the necessity of requiring tightly controlled operating conditions which, specifically, necessitate several different temperature zones which must be perfectly regulated. A further drawback results because the operation of the process must take place in the presence of chlorine and/or hydrochloric acid which are themselves capable of attacking the substrate or even the deposit itself while it is in the course of being formed. Yet another problem with the process is that deposition of III-V semi-conductor compositions which are ternary or quaternary is not possible because of the strict operating conditions required.

In another known method referred to as the organometallic process, a gaseous mixture comprising an alkylated composition comprising a group III element and either a hydrogenated or an alkylated composition of a group V element is decomposed in the presence of a substrate. The conditions for carrying out this type of process are much more flexible than in the preceeding process and it is possible, in particular, to deposit semiconductor compositions which are ternary or quaternary. However, to obtain the formation of a semi-conductor composition of a given stoichiometric composition having the desired electronic properties, it is necessary to use a gaseous mixture in which the concentration of the group V element is between ten and one hundred times greater than that of the group III compound and that the ratio be perfectly adjusted in this range with respect to the concentration of the group III derivative. If this condition is not closely met, the semiconductor composition obtained is heavily doped, i.e., it has a very elevated transport number. Moreover, the process has the drawback that it leads to the necessity for an overabundant use of the group V composition. Moreover, the alkylated derivatives of group III and of group V have a very high reactivity and are, as a result, very difficult to handle and difficult to purify. Additionally, the hydrogenated derivatives of alkylated derivatives of certain group V elements (particularly arsenic and antimony) are extremely toxic and require very tight and carefully controlled operating conditions.

SUMMARY OF THE INVENTION

It is an object of the invention to specifically avoid the necessity for using dangerous compositions.

Another objective of the invention is to facilitate the conditions necessary to obtain a deposit of electronic purity by using starting materials which are easily purifiable.

Yet a further object of the invention is to make possible the obtention of semi-conductor compositions which are binary as well as ternary or quaternary.

Another objective of the invention is to make possible the deposition of polycrystalline layers as well as monocrystalline epitaxial layers; monocrystalline layers being most sought after in applications relating to the fabrication of electronic semi-conductor components or devices.

These and other objects of the inventions are fulfilled by the process for depositing a layer of semi-conductor composition which comprises elements M(III) and M'(V) selected from group III and group V elements, respectively, onto a substrate. The process comprises contacting the substrate with a coordination compound in the gaseous phase. The compound has the formula:

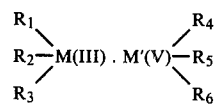

wherein M(III) and M'(V) are bonded to one another by a donor/acceptor bond and wherein $R_1$, $R_2$, $R_3$, $R_4$, $R_5$, and $R_6$ are chemical radicals other than hydrogen. At least one of the radicals $R_1$, $R_2$, and $R_3$ is an electron donor serving to stabilize the donor/acceptor bond between elements M(III) and M'(V). The process further comprises thermally decomposing the coordination compound so as to break the chemical bonds between the radicals and elements M(III) and M'(V) without breaking the donor/acceptor bond so as to cause the semi-conductor composition to deposit onto the substrate.

A further aspect of the invention relates to substrates having a semi-conductor layer, comprising elements selected from groups III and V, deposited by the process of the invention.

BRIEF DESCRIPTION OF THE DRAWINGS

The FIGURE illustrates a schematic view of the apparatus used with the process of the invention.

DESCRIPTION OF THE PREFERRED EMBODIMENTS

The present invention attempts to solve the problems associated with the prior art by providing a novel process of chemically depositing a semi-conductor comprising group III and group V elements from the vapor phase while taking advantage of very flexible operating conditions. The inventive process does not use gaseous mixtures of the type previously described with respect to the organometallic process and is free of the inconveniences resulting from the presence of these mixtures. A further advantage of the invention is that it permits deposition of semi-conductor material without the need for extraordinary precautions.

The process of the invention for manufacturing a layer of a semi-conductor composition of elements M(III) and M'(V) of groups III and V on a substrate comprises: utilizing a coordination compound

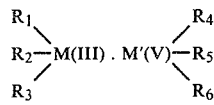

including elements M(III) and M'(V) bonded to one another by a donor/acceptor bond, as well as, the chemical radicals $R_1$, $R_2$, $R_3$, $R_4$, $R_5$, and $R_6$, other than hydrogen, attached to each of these elements. At least one of the radicals $R_1$, $R_2$, and/or $R_3$ which is attached to the element M(III) is an electron donor stabilizing the donor/acceptor bond between the elements M(III) and M'(V). The process further comprises contacting the coordination compound in the vapor phase with a substrate and causing the thermal decomposition of the coordination compound in a manner which breaks the chemical bonds other than the donor/acceptor bond and causes the deposit of the M(III) M'(V) semi-conductor composition on the substrate. Thus, the process of the invention leads to the use of a coordination compound including both the elements M(III) and M'(V), which make up the semi-conductor composition M(III) M'(V) to be deposited, in a strict stoichiometric 1/1 ratio of the semi-conductor composition. As has been shown by the various experiments, actually performed, which are illustrated towards the end of this application, the coordination compound is a stable body of low reactivity and has a low vapor pressure at ambient temperature. Additionally, when working with toxic cores such as arsenic or antimony a complex is formed in which the toxic character of the core bodies is masked. The electron donor radicals ($\pi$ electrons, p electrons, etc.) stabilize the donor/acceptor bond between the group III-V elements such that the thermal decomposition causes the bonds between the radicals and elements M(III) and M'(V) to break without altering the M(III)–M'(V) bond. Under these conditions a stoichiometric deposit of the M(III) M'(V) composition results.

The radicals $R_1$, $R_2$, $R_3$, $R_4$, $R_5$, and $R_6$ are radicals other than hydrogen thus avoiding thermal polymerization of the coordination compound which would normally result with hydrogen at normal temperatures. In effect, the hydrogen radical or radicals of a molecule have a tendency to combine with other radicals of the molecule to give a composition which separates off and causes the polymerization of the remaining molecules as a result of the liberated bonds. The resulting polymer is inappropriate to make a chemical deposit from the vapor phase possible as a result of the physical properties of the polymer, i.e., a solid which is not easily vaporizable.

Experiments have shown that the process of the invention permits polycrystalline as well as epitaxial monocrystalline deposition. As will be seen from the examples described below, the formation of a polycrystalline or a monocrystalline epitaxial deposit is a function of the contact conditions between the coordination compound and the substrate. As a general proposition, a polycrystalline deposit results when the coordination compound gas velocities are high relative to the substrate or when the concentration of the compound is elevated. In the alternative, in order to obtain a monocrystalline deposit, the coordination compound must be slowly brought into contact with the substrate at low concentrations. In this latter situation, the parameters of the crystalline network of the substrate must be compatible i.e., sufficiently similar to that of the crystalline network of the deposit.

SYNTHESIS

The manufacture of a coordination compound of the type:

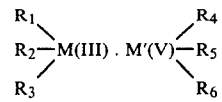

regardless of the base elements M(III) and M'(V), is known in and of itself and is disclosed in a thesis by R. Haran (Toulouse, September 1972, Paul Sabatier University), and the work by G. E. Coates, entitled "Organometallic Compounds" edited by Met Huen, published by John Wiley, New York, 1960, the disclosures of which are herein incorporated by reference.

Generally speaking, these compositions are made by condensing, at a low temperature, a Lewis base having the composition:

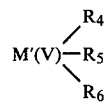

corresponding to the coordination compound, and adding in an amount less than the Lewis base, while still at low temperature, a Lewis acid having the composition:

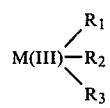

corresponding to the coordination compound; progressively bringing the temperature of the mixture to ambient temperature; trapping Lewis base excess; and purifying the product obtained by distillation to produce a pure coordination compound.

Where necessary, after having brought the Lewis acid/base mixture to ambient temperature, it may be desirable to slightly heat the mixture between 60° and 100° C. so as to increase the yield of the complexing reaction yielding the coordination compound.

SELECTION OF RADICALS

The choice of the radicals $R_1$, $R_2$, $R_3$, $R_4$, $R_5$, and $R_6$ is a function of two essential criteria depending on the base elements M(III) and M'(V) concerned. The electron donor radicals $R_1$, $R_2$, and/or $R_3$ must provide as good stabilization as possible. Since a coordination compound whose physical properties most facilitate chemical deposit from the vapor phase must be used, the radicals must result in a compound whose vapor pressure increases to a significant extent with the temperature so as to facilitate the vaporization of the composition, while nevertheless having radical/element M(III) and M'(V) bonds of moderate energy which reduces the energy necessary for the decomposition of these bonds thus avoiding parasitic breaking of the donor/acceptor bond.

By way of example, chlorine may constitute radical $R_1$ as an electron donor (p electrons) since it is perfectly adapted to satisfy the previously recited conditions for elements M(III) and M'(V) made up of conventional semi-conductors of group III and V such as M(III) being selected from the group comprising: boron, aluminum, gallium, or indium; and M'(V) being selected from the group comprising: nitrogen, phosphorus, arsenic or antimony. The coordination compound may comprise a single electron donor radical formed by an atom of chlorine or two radicals formed by two atoms of chlorine or even three radicals formed by three such atoms.

The coordination compound can equally comprise two or three p electron donor radicals, each one constituted by an atom of bromine. Such radicals are perfectly suited for compounds comprising an element M(III) which comprises: boron, aluminum, or gallium and an element M'(V) comprising: a member selected from the group comprising nitrogen, phosphorus, arsenic or antimony.

When using indium as M(III), coordination compounds formed with atoms of bromine possess an elevated desity which does not favor chemical deposit from the vapor phase. It is, therefore, preferable in such compounds to utilize either chlorine, as mentioned above, or, three benzyl $C_6H_5$ radicals, which are $\pi$ electron donors, or a combination of the two comprising one atom of chlorine and two benzyl radicals.

Generally, the non-electron donor radicals advantageously comprise $C_2H_5$ ethyl/radicals which confer desirable physical properties to the coordination compounds.

In the case of an element M(III) comprising indium, experiments show that, with an $R_1$ electron donor radical constituted by an atom of chlorine, it is possible to choose radicals $R_2$ and $R_3$ which are not donors, such as $C_6H_{13}$ hexyl radicals or $C_6H_{11}$ cyclohexyl radicals. The remaining radicals $R_4$, $R_5$, and $R_6$ can notably comprise $C_2H_5$ ethyl radicals.

A preferred method according to the invention comprises charging a carrier gas, particularly a rare gas, with vapors of the coordination compound, bringing the compound to a temperature comprising between about 30° C. and 180° C., bringing the charged gas into contact with the substrate and decomposing the coordination compound by heating the substrate to a temperature between about 400° and about 750° C., above the temperature at which the bonds between M(III) and M'(V) and the different radicals are broken yet below the temperature at which disassociation of the donor/acceptor bonds of the coordination compound begins to occur.

To obtain monocrystalline epitaxial deposits on the substrate having compatible crystalline parameters, the charged carrier gas of the coordination composition is brought into contact with the substrate while in laminar flow at speeds closely approximating between about 0.7 and about 2 cm per second; with speeds on the order of about 1 to about 1.5 cm per second yielding good results. Above the upper limit of the indicated range, the probabilities of obtaining a polycrystalline deposit are increased, as for example, under the influence of even the slightest turbulence in the carrier gas. Below the lower limits of the range, a retrodiffusion phenomena is observed with respect to a portion of the vapors produced by virtue of decomposition of the compound. These vapors return countercurrently (by reason of the too slow speed of the carrier gas) and disrupt contact conditions between the substrate and the charged vapor gas of the compound.

Under the above conditions, the diameter of the reactor containing the substrate is preferably above a threshhold on the order of about 2 cm. Below this diameter it is difficult, in practice, to satisfy the speed and flow conditions discussed above.

It should be noted that the process lends itself perfectly to the manufacture of group (III)-(V) semi-conductor layers doped by means of elements of group (VI) or (II) (in particular sulfur, selenium, or zinc, cadmium). This may be done by introducing dopants in appropriate proportions, in the form of vapors or in the form of volatile alkyl compositions, into the charged carrier gas of the coordination compound before the gas is brought into contact with the substrate.

Furthermore, the process according to the invention, is applicable to manufacture films or layers of ternary or quaternary semi-conductor compositions of several group (III) and (V) elements. Such a process comprises utilizing a mixture of several coordination compounds such as defined above, each one comprising a group (III) and a group (V) element. The mixture has a composition adapted to the formula of the semi-conductor composition to be deposited.

For example, the ternary composition $M_1(III)_x M_2(III)_{(1-x)} M'(V)$ can be deposited on a substrate by forming a mixture of two coordination compounds:

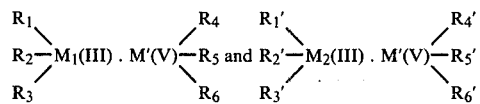

and by decomposing a mixture of the vapors of these compounds in the presence of the substrate.

DEPOSITION APPARATUS

The description which follows furnishes several examples of performing the process. The examples were conducted by means of an apparatus of the type which is schematically illustrated in the FIGURE and which is described below.

The apparatus essentially comprises a bubble chamber 1 whose temperature is thermostatically adjustable and which contains the coordination compound of interest in the liquid phase. The apparatus further comprises a reactor tube containing the substrate to be coated (shown schematically as 3). The reactor may be heated by an oven 4. In the course of the Examples, two reactor dimensions were used; 1 centimeter diameter and 2.2 cm in diameter.

A conduit 5 provided with a valve 6, a flow meter 7 and a manometer 8, makes it possible to bring the carrier gas into the bubble chamber 1. The gas leaves charged with the vapors of the coordination compound by means of a heat-insulated conduit which leads to the reactor.

The bubble chamber 1 can be switched out of the circuit by means of a line 10 by means of an appropriate valve system 11.

At the outlet of the reactor, the carrier gas and the gaseous decomposition products are brought by a conduit 12 into a cooled liquid nitrogen trap 13 and leave through a conduit 14 provided with a manometer 15, a valve 16, and a vacuum pump 17.

In operation the coordination compound is placed in the bubble chamber 1 and the substrate in the reactor 2. The apparatus is placed under vacuum downstream of valve 6 with the aid of pump 17, while the bubble chamber is removed from the system circuit by means of the valves 11. The apparatus is filled and flushed with the carrier gas for one hour with the chamber 1 off stream. The bubble chamber and oven are heated to the desired temperatures and the pressure and flow rate of the gas are adjusted by means of manometers 8 and 15 and valves 6 and 16. The valve system 11 is then adjusted to place the bubble chamber on stream which results in the semi-conductor composition beginning to deposit on the substrate. At the end of the process, the bubble chamber is taken off stream while the bubble chamber and reactor are heated for 15 minutes more until they each return to ambient temperature.

Naturally, the apparatus used, as well as the operating conditions recited, are merely exemplary of techniques which may be used within the scope of the invention. Several examples of depositions actually performed are set forth below.

EXAMPLE 1—Deposit of Ga As

The coordinate compound used in this example was:

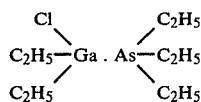

The compound is liquid at ambient temperature and has virtually no vapor pressure at that temperature. The compound was made by means of the general method previously discussed starting with the Lewis base As $(C_2H_5)_3$ condensed to $-80°$ C. and the Lewis acid Ga $(C_2H_5)_2Cl$ which is added in an amount less than the base.

To vaporize the coordination compound, the compound is heated in the bubbler to a temperature of about 80° C. The carrier gas utilized comprises helium at a pressure of 1.1 atmospheres and a flow rate of 6 liters per hour. The reactor utilized has a diameter of 1 cm. The flow rate corresponds to a velocity of the gas in the reactor of 2.12 cm/sec.

The procedure was repeated on four types of substrates successively placed in the reactor 2. The substrates used were a cleaved crystal of fluorine; a polished corundum crystal; a crystal of galium arsentate and a crystal of germanium.

The substrates were heated to 600° C. and the helium carrier, charged with vapors of the coordination compound, was made to circulate in the reactor for a period of three hours.

At the end of the experiment a grey polycrystalline layer of Ga As is observed on each of the substrates. The nature of this layer is identified by x-ray diffraction and by observation of secondary emissions under an electron beam with an E.D.A.X. apparatus.

The thickness of this layer measured by a sweeping electronic micorscope is, in this example, approximately 3 microns and was analogous for the four substrates.

EXAMPLE 2—Deposit of Ga As

The conditions of this experiment were the same as in Example 1 with the exception that the carrier gas comprised argon but under the same conditions of pressure and flow rate as in Example 1.

The results achieved were identical to those of Example 1.

EXAMPLE 3—Deposit of Ga As

The conditions of this experiment were the same as in Example 1 except that the temperature of the substrates was 500° C. and the duration of circulation of the gas in the reactor was 7 hours.

The layer deposited is of the same nature as in the previous Examples having a thickness of approximately 2 microns. It is thus seen that despite a longer period of carrier gas circulation, the layer deposited is less substantial and the losses were greater.

EXAMPLE 4—Deposit of Ga As

Example 3 was repeated with a carrier gas other than a rare gas, specifically hydrogen, under the same conditions of flow rate and pressure as in the previous examples.

The layer of Ga As observed was very thin and had a thickness of less than 1 micron. A deposit of arsenic was observed in the terminal portion of the unheated reactor which apparently indicates that there was a splitting of certain donor/acceptor bonds, with formation of arsine $AsH_3$ which decomposes to give the arsenic deposit.

It is thus seen that a rare gas should preferably be used as the carrier gas to avoid the risks of competing reactions.

EXAMPLE 5—Deposit of Ga As

Example 4 was repeated while working under a reduced hydrogen pressure, equal to 50 mm of Hg, the flow rate being 2 liters per hour.

Trace amounts of Ga As are observed on the substrates while a very significant quantity of arsenic was deposited on the walls of the reactor at its outlet.

The reduction of pressure favors the breaking of the donor/acceptor bonds and it is, therefore, preferable to use higher pressures, at least equal to atmospheric pressure.

EXAMPLE 6—Deposit of Ga As

This experiment was performed with a coordination compound of the type:

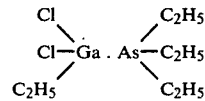

which was made by the conventional method starting with a Lewis base As $(C_2H_5)_3$ and a Lewis acid Ga $C_2H_5 Cl_2$.

This experiment was carried out under the following conditions using a reactor having a diameter of 1 cm:

vaporization temperature of the compound: 100° C.;

carrier gas: helium at a pressure of 1.1 atmospheres and a flow rate of 6 liters per hour;

temperature of the substrates (same materials as those previously tested): 650° C.; and period of gas circulation: 3 hours.

At the end of the experiment a polycrystalline layer of Ga As having a thickness of about 2 microns was observed.

EXAMPLE 7—Deposit of Ga P

This experiment was carried out with a coordination compound of:

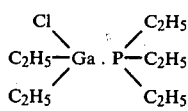

which was made by following the conventional method starting from a Lewis base P $(C_2H_5)_3$ and a Lewis acid Ga Cl$(C_2H_5)_2$.

The experiment was carried out under the following conditions in a reactor having a diameter of 1 cm:

vaporization temperature of the compound: 120° C.;

carrier gas: helium at a pressure of 1.1 atmospheres and at a flow rate of 6 liters per hour;

temperature of the substrates (analagous to the preceding): 650° C.; and period of gas circulation: 3 hours.

At the end of the experiment a yellow-orange polycrystalline layer of Ga P is observed on each of the substrates. The thickness of this layer is on the order of 3 microns.

EXAMPLE 8—Deposit of Ga N

This experiment was carried out with a coordination compound:

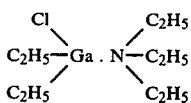

made according to the previously recited conventional method starting from the Lewis base N$(C_2H_5)_3$ and the Lewis acid GaCl$(C_2H_5)_2$.

The experiment was conducted in a reactor having diameter of 1 cm under the following conditions:

vaporization temperature of the compound: 110° C.;

carrier gas: helium at a pressure of 1.1 atmospheres and at a flow rate of 6 liters per hour;

temperature of the substrates (analagous to those preceding): 700° C.; and period of gas circulation: 5 hours.

At the end of the experiment a grey polycrystalline layer of Ga N was observed on the substrates. The thickness of this layer was on the order of 1 micron.

EXAMPLE 9—Deposit of Al P

This deposition was carried out with the coordination compound:

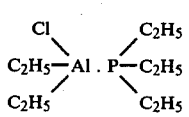

made according to the conventional method starting with the Lewis base P$(C_2H_5)_3$ and the Lewis acid Al Cl$(C_2H_5)_2$. The experiments were carried out under the following conditions in a reactor having a diameter of 1 cm:

vaporization temperature of the compound: 80° C.;

carrier gas: helium at a pressure of 1 atmosphere and at a flow rate of 3 liters per hour;

temperature of the substrates (analogous to those preceding): 660° C.;

period of gas circulation: 4 hours; and gas velocity: 1.06 cm/sec.

At the end of the experiments a grey polycrystalline layer of Al P having a thickness of approximately 3 microns was observed.

EXAMPLE 10—Deposit of Al N

This example was carried out by means of a coordination compound having the composition:

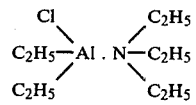

made by the previously recited conventional method starting from the Lewis base N$(C_2H_5)_3$ and the Lewis acid AlCl$(C_2H_5)_2$.

The deposition was carried out in a reactor having a diameter of 1 cm under the following conditions:

vaporization temperature of the compound: 110° C.;

carrier gas: helium at a pressure of 1 atmosphere and a flow rate of 3 liters per hour;

temperatures of the substrates (analogous to the preceding): 670° C.;

period of gas circulation: 10 hours; and gas velocity: 1.06 cm/sec.

At the end of the process a yellow polycrystalline layer of Al N having a thickness on the order of 5 microns was observed on each of the substrates.

EXAMPLE 11—Epitaxial Deposition of Ga As

This deposition was carried out by means of the same coordination compounds as were utilized in examples 1, 2, 3, 4, and 5.

The substrate is germanium having a (111) crystalline face orientation which is n doped.

The crystallographic paramater of this material which crystalizes in the cubic system and has centered faces is a=5.657 Å and is very close to that of galium arsenate Ga As which crystalizes in the same type of system (a=5.653, i.e., a difference of 0.08%).

The process was carried out in a reactor having a diameter of 2.2 cm under the following conditions:

vaporization temperature of the compound: 35° C.;

carrier gas: helium at a pressure of 1.1 atmospheres and a flow rate of 15 liter/hr which equals a velocity through the reactor of 1.1 cm/sec.;

temperature of the substrate: 480° C.; and period of gas circulation: 3 hours.

It should be noted that the vaporization temperature of the compound was substantially reduced as compared with the preceeding analogous examples, to lower the concentration of the coordination compound in the carrier gas and thus favor the emergence of the epitaxial character of the layer.

Upon completion of the process, a grey monocrystalline epitaxial layer of Ga As having a thickness of about 3 microns was observed on the substrate. The epitaxial character of the deposit was verified by electron diffraction through reflection of an analysis surface of 3 mm². The diffraction pattern does not have any rings and comprises only a network of points characteristic of an epitaxial monocrystalline layer.

The layer deposited is of the n type with a mobility of 2,500 cm$^2$/volt/sec at ambient temperatures and 11,000 cm$^2$/volt/sec at the temperature of liquid nitrogen. The number of carriers is approximately $5 \times 10^{17}$ per cm$^3$.

It should be noted that the above values were obtained without any particular precautions with respect to the nature of the reactor used. Although Pyrex was used, in practice, when manufacturing electronic components or devices, the reactor may be chosen so as to avoid any risks of introducing impurities which would detract from the above values so that these values may be substantially improved.

EXAMPLE 12—Epitaxial Deposition of Ga As

The procedure was carried out in the same manner as Example 11 on a substrate of germanium having a (111) face orientation which is p doped.

The results were identical to those of Example 11 and an epitaxial monocrystalline deposited of Ga As analogous to the proceeding layer was achieved.

EXAMPLE 13—Epitaxial Deposition of Ga As

The procedure was carried out under the same conditions as Examples 11 and 12 on a semi-insulated monocrystalline gallium arsenate Ga As substrate having a (100) face orientation; the period of circulation of the carrier gas was limited to one hour.

A monocrystalline epitaxial layer of Ga As having a thickness of about 1 micron was observed upon completion of the process.

EXAMPLE 14—Epitaxial Deposition of Al P

This deposition was carried out by means of the same coordination compound as was utilized in Example 9.

The substrate is made out of silicon, having a (111) crystalline face orientation, undoped, crystalizing in the cubic system having centered faces (a=5.431 Å). This parameter is close to that of Al P which crystalizes in the same system (a=5.451 Å i.e., a difference of 0.37%).

The deposition was carried out in a reactor having a diameter of 2.2 cm under the following conditions:
vaporization temperature: 90° C.;
carrier gas: helium at 1.1 atmospheres and flow rate of 15 liters per hour (speed=1.1 cm/sec);
temperature of the substrate: 625° C.; and
period of gas circulation: 10 hours.

At the end of the process a yellow-orange epitaxial monocrystalline layer was observed on the substrate. The layer has a thickness of approximately 1 micron. The epitaxial character of the deposit was verified in the same fashion as in the three preceding Examples.

The process of the invention is applicable to the manufacture of a wide variety of different electronic semiconductor devices such as diodes, triodes, transistors, and other such electronic junctions.

It should be understood, of course, that the invention is not limited to those specific materials, apparatus, and operational parameters disclosed and thus extends to cover all alternative and equivalent materials and embodiments. The invention is thus not limited to the particulars disclosed and covers all embodiments falling within the scope of the claims.

What is claimed is:

1. A process for depositing a layer of a semi-conductor composition, said layer comprising elements M(III) and M'(V) selected from group III and group V elements respectively, onto a substrate, said process comprising the steps of:

contacting said substrate with a coordination compound in the gaseous phase, said compound having the formula:

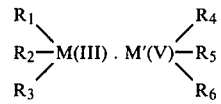

wherein M(III) and M'(V) are bonded to one another by a donor/acceptor bond and wherein $R_1$, $R_2$, $R_3$, $R_4$, $R_5$, and $R_6$ are chemical radicals other than hydrogen; at least one of said radicals of $R_1$, $R_2$, and $R_3$ being an electron donor serving to stabilize said donor/acceptor bond between said elements M(III) and M'(V); and thermally decomposing said coordination compound so as to break the chemical bonds between said radicals and said elements M(III) and M'(V) without breaking said donor/acceptor bonds so as to cause said semi-conductor composition to deposit onto said substrate.

2. The process as defined by claim 1 wherein said semi-conductor composition comprises an element M(III) selected from the group comprising: boron, aluminum, gallium, or indium; and element M'(V) is selected from the group comprising: nitrogen, phosphorus, arsenic, or antimony.

3. The process as defined by claim 2 wherein at least one of the radicals $R_1$, $R_2$, and $R_3$ of said coordination compound is a p electron donor.

4. The process as defined by claim 3 wherein said p electron donor is a chlorine atom.

5. The process as defined by claim 4 wherein the remaining radicals which are not electron donors comprise ethyl $C_2H_5$ radicals.

6. The process as defined by claim 1 wherein said semi-conductor composition comprises an element M(III) selected from the group comprising: boron, aluminum, and gallium; and said element M'(V) is selected from the group comprising: nitrogen, phosphorus, arsenic, or antimony; and wherein at least two of said radicals $R_1$, $R_2$, and $R_3$ of said coordination compound are p electron donors and each of said p electron donors is a bromine atom.

7. The process as defined by claim 6 wherein the remaining radicals which are not electron donors comprise ethyl $C_2H_5$ radicals.

8. The process as defined by claim 6 wherein each of said p electron donors are bromine atoms.

9. The process as defined by claim 1 wherein said semi-conductor composition comprises indium as element M(III) and said element M'(V) is selected from the group comprising: nitrogen, phosphorus, arsenic or antimony; and wherein each of said radicals $R_1$, $R_2$, and $R_3$ are $\pi$ electron donors.

10. The process as defined by claim 9 wherein each of the said $\pi$ electron donor radicals $R_1$, $R_2$, and $R_3$ are benzyl radicals $C_6H_5$.

11. The process as defined by claim 10 wherein the remaining radicals which are not electron donors comprise ethyl $C_2H_5$ radicals.

12. The process as defined by claim 1 wherein said coordination compound is decomposed by heating said substrate to a temperature between about 400° C. and 750° C. above the temperature at which the bonds between M(III) as well as M'(V) and said radicals are broken but below the temperature at which said donor- /acceptor bond of said coordination compound disassociates.

13. The process as defined by claim 1 wherein said element M(III) is indium and said element M'(V) is an element selected from the group comprising: nitrogen, phosphorus, arsenic and antimony; and wherein each of said three radicals, $R_1$, $R_2$, $R_3$, are electron donor radicals $C_6H_5$.

14. The process as defined by claim 13 wherein said carrier gas is a rare gas.

15. The process as defined by claim 13 wherein the remaining radicals other than said electron donor radicals comprise ethyl $C_2H_5$ radicals.

16. The process as defined by claim 1 wherein the remaining radicals which are not electron donors comprise ethyl $C_2H_5$ radicals.

17. The process as defined by claim 1 wherein said semi-conductor composition comprises indium as the M(III) element and element M'(V) is selected from the group comprising: nitrogen, phosphorus, arsenic, and antimony; wherein said radical $R_1$ is a p electron donor and said two radicals $R_2$ and $R_3$ are non-electron donors selected from the group of radicals comprising: hexyl, $C_6H_{13}$ and cyclohexyl, $C_6H_{11}$.

18. The process as defined by claim 17 wherein said radical $R_1$ is chlorine.

19. The process as defined by claim 1 which further comprises contacting said substrate with said coordination compound by loading said coordination compound, in the gaseous state, into a carrier gas and contacting said carrier gas with said substrate.

20. The process as defined by claim 19 wherein said carrier gas is contacted with said substrate at a pressure at least equal to atmospheric pressure.

21. The process as defined by claim 19 which comprises charging said carrier gas with said coordination compound by heating said compound to a temperature between about 30° C. and 180° C.

22. The process as defined by claim 21 wherein said coordination compound is decomposed by heating said substrate to a temperature between about 400° C. and 750° C. above the temperature at which the bonds between M(III) as well as M'(V) and said radicals are broken but below the temperature at which said donor/acceptor bond of said coordination compound disassociates.

23. The process as defined by claim 21 further comprising removing gases formed as a result of said thermal decomposition by entraining said gases in said carrier gas.

24. The process as defined by claim 21 wherein said carrier gas, charged with said coordination compound, is brought into contact with said substrate while in laminar flow so as to form a monocrystalline epitaxial layer.

25. The process as defined by claim 24 which comprises flowing said carrier gas in contact with said substrate at a velocity between about 0.7 and 2 cm/sec.

26. The process as defined by claim 24 wherein said coordination compound is decomposed by heating said substrate to a temperature between about 400° C. and 750° C. above the temperature at which the bonds between M(III) as well as M'(V) and said radicals are broken but below the temperature at which said donor/acceptor bond of said coordination compound disassociates.

27. The process as defined by claim 19 wherein said coordination compound is decomposed by heating said substrate to a temperature between about 400° C. and 750° C. above the temperature at which the bonds between M(III) as well as M'(V) and said radicals are broken but below the temperature at which said donor/acceptor bond of said coordination compound disassociates.

28. The process as defined by claim 1 wherein said semi-conductor layer is made by decomposing a plurality of coordination compounds each of which comprises one element M(III) selected from group III and one element M'(V) selected from group V.

* * * * *

UNITED STATES PATENT AND TRADEMARK OFFICE
CERTIFICATE OF CORRECTION

PATENT NO. : 4,250,205
DATED : February 10, 1981
INVENTOR(S) : Georges CONSTANT et al It is certified that error appears in the above—identified patent and that said Letters Patent is hereby corrected as shown below:

Column 11, line 19, "deposited" should be --deposit--.
line 20, "proceeding" should be --preceding--.
Column 1, line 61, "of" should be --or--.
Column 4, line 47, after "mixture", insert --to--.
Column 5, line 43, delete "comprising".
line 64, "phenomena" should be --phenomenon--.
Column 6, line 18, delete "," (2nd occurence).
Column 10, line 41, "crystalographic" should be --crystallographic--.
line 41, "paramater" should be --parameter--.
line 43, "galium" should be --gallium--.
line 44, "crystalizes" should be --crystallizes--.
Column 11, line 36, "crystalizing" should be --crystallizing--.
line 38, "crystalizes" should be --crystallizes--.

Signed and Sealed this

Twenty-third Day of June 1981

[SEAL]

Attest:

RENE D. TEGTMEYER

*Attesting Officer*   *Acting Commissioner of Patents and Trademarks*